(12) United States Patent
Ozasa

(10) Patent No.: US 11,444,597 B2
(45) Date of Patent: Sep. 13, 2022

(54) ACOUSTIC WAVE FILTER DEVICE

(71) Applicant: Murata Manufacturing Co., Ltd., Nagaokakyo (JP)

(72) Inventor: Motoki Ozasa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 418 days.

(21) Appl. No.: 16/701,206

(22) Filed: Dec. 3, 2019

(65) Prior Publication Data

US 2020/0106417 A1  Apr. 2, 2020

Related U.S. Application Data

(63) Continuation of application No. PCT/JP2018/020993, filed on May 31, 2018.

(30) Foreign Application Priority Data

Jun. 5, 2017 (JP) .............................. JP2017-110574

(51) Int. Cl.
*H03H 9/02* (2006.01)
*H03H 9/64* (2006.01)
*H03H 9/72* (2006.01)

(52) U.S. Cl.
CPC ...... *H03H 9/02952* (2013.01); *H03H 9/6433* (2013.01); *H03H 9/725* (2013.01)

(58) Field of Classification Search
CPC ... H03H 9/02952; H03H 9/6433; H03H 9/725
See application file for complete search history.

(56) References Cited

U.S. PATENT DOCUMENTS

| | | | |
|---|---|---|---|
| 2004/0196119 A1 | 10/2004 | Shibahara et al. | |
| 2013/0154763 A1* | 6/2013 | Takamine | H03H 9/725 333/195 |
| 2013/0187730 A1 | 7/2013 | Nishizawa et al. | |

(Continued)

FOREIGN PATENT DOCUMENTS

| | | |
|---|---|---|
| JP | 05-167387 A | 7/1993 |
| JP | 07-030362 A | 1/1995 |

(Continued)

OTHER PUBLICATIONS

Official Communication issued in International Patent Application No. PCT/JP2018/020993, dated Jul. 31, 2018.

*Primary Examiner* — Samuel S Outten
(74) *Attorney, Agent, or Firm* — Keating & Bennett, LLP

(57) ABSTRACT

An acoustic wave filter device includes first and second acoustic wave filters provided on a piezoelectric substrate, an insulating layer that is provided on the piezoelectric substrate and has a smaller dielectric constant than the piezoelectric substrate, a first wiring conductor electrically connected to an electrode of the first acoustic wave filter, a second wiring conductor electrically connected to an electrode of the second acoustic wave filter, the first wiring conductor and the second wiring conductor facing each other on the insulating layer in plan view, and a ground conductor located between the insulating layer and the piezoelectric substrate in a region A circumscribing the first wiring conductor and the second wiring conductor on the insulating layer in plan view.

19 Claims, 5 Drawing Sheets

(56) References Cited

U.S. PATENT DOCUMENTS

2014/0113571 A1* 4/2014 Fujiwara .............. H03H 9/0028
455/73
2016/0094198 A1* 3/2016 Takamine ................ H03H 9/54
333/186
2017/0331456 A1* 11/2017 Ono ..................... H03H 9/6483

FOREIGN PATENT DOCUMENTS

| JP | 2004-282707 A | 10/2004 |
| JP | 2013-153289 A | 8/2013 |

* cited by examiner

ACOUSTIC WAVE FILTER DEVICE

CROSS REFERENCE TO RELATED APPLICATIONS

This application claims the benefit of priority to Japanese Patent Application No. 2017-110574 filed on Jun. 5, 2017 and is a Continuation Application of PCT Application No. PCT/JP2018/020993 filed on May 31, 2018. The entire contents of each application are hereby incorporated herein by reference.

BACKGROUND OF THE INVENTION

1. Field of the Invention

The present invention relates to an acoustic wave filter device including a plurality of acoustic wave filters.

2. Description of the Related Art

Acoustic wave filters using acoustic waves have been widely used in band pass filters in front-end portions of mobile communication devices. Acoustic wave filter devices each including a plurality of acoustic wave filters to support the combination of, for example, multiple modes or multiple bands are actually used.

In an acoustic wave filter device in which a plurality of acoustic wave filters are formed at a single piezoelectric substrate, wiring conductors are densely arranged. The wiring conductors for propagating signals for the different acoustic wave filters are therefore coupled via the piezoelectric substrate. Degradation in insertion loss characteristics easily occurs because of the leakage of signals.

To solve this problem, for example, the acoustic wave device disclosed in Japanese Unexamined Patent Application Publication No. 2013-153289 suppresses the capacitive coupling between adjacent wiring conductors by including, between each wiring conductor and a piezoelectric substrate, an insulating layer whose dielectric constant is smaller than that of the piezoelectric substrate.

However, if further downsizing of devices is achieved, the degradation in insertion loss characteristics may not be sufficiently suppressed with configurations in the related art.

SUMMARY OF THE INVENTION

Preferred embodiments of the present invention provide acoustic wave filter devices that each include a plurality of acoustic wave filters, is small in size, and has excellent insertion loss characteristics.

An acoustic wave filter device according to a preferred embodiment of the present invention includes a first acoustic wave filter and a second acoustic wave filter provided on a piezoelectric substrate, an insulating layer that is provided on the piezoelectric substrate and has a smaller dielectric constant than the piezoelectric substrate, a first wiring conductor electrically connected to an electrode of the first acoustic wave filter, a second wiring conductor electrically connected to an electrode of the second acoustic wave filter, the first wiring conductor and the second wiring conductor facing each other on the insulating layer in plan view, and a ground conductor provided between the insulating layer and the piezoelectric substrate in a region circumscribing the first wiring conductor and the second wiring conductor on the insulating layer in plan view.

Acoustic wave filter devices according to preferred embodiments of the present invention significantly reduce or prevent the leakage of a signal by preventing the coupling between the first wiring conductor that propagates a signal for the first acoustic wave filter and the second wiring conductor that propagates a signal for the second acoustic wave filter using the ground conductor. As a result, acoustic wave filter devices that each include a plurality of acoustic wave filters, is small in size, and has excellent insertion loss characteristics are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below using working examples and with reference to the drawings. It is to be noted that all of the preferred embodiments to be described below represent generic or specific examples. Numerical values, shapes, materials, elements, arrangements of the elements, connection modes, and other features indicated in the following preferred embodiments are merely examples, and are not intended to limit the scope of the present invention. Of the elements included in the following preferred embodiments, those not recited in the independent claim of the present invention are described as optional elements.

Preferred Embodiment

As an example of an acoustic wave filter device according to a first preferred embodiment of the present invention, an acoustic wave filter device including a first acoustic wave filter and a second acoustic wave filter provided on a piezoelectric substrate will be described.

Figure 1:
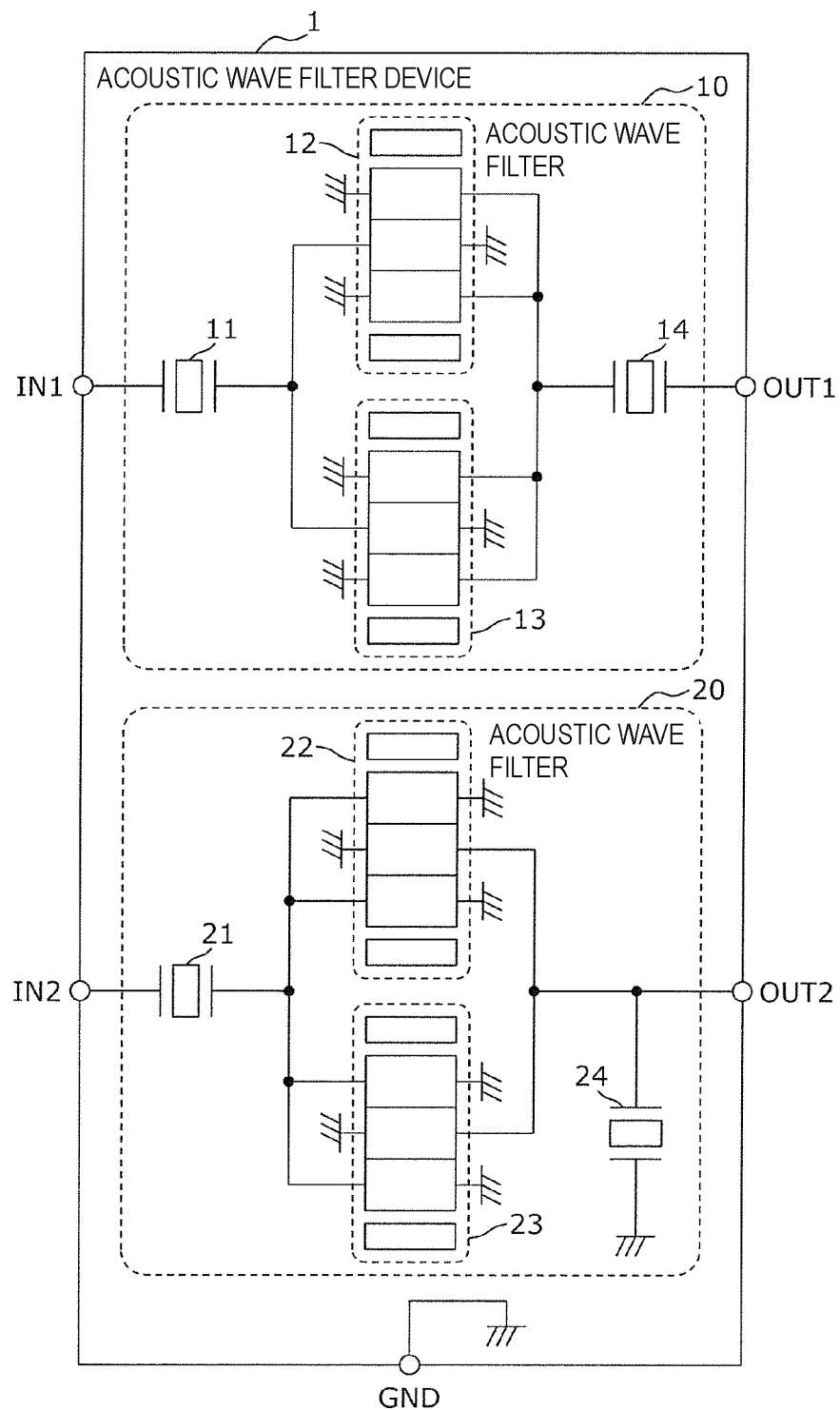
FIG. 1 is a circuit diagram showing an example of an acoustic wave filter device according to a preferred embodiment of the present invention.

FIG. 1 is a circuit diagram showing an example of an acoustic wave filter device 1 according to the first preferred embodiment. As shown in FIG. 1, the acoustic wave filter device 1 includes acoustic wave filters 10 and 20. The acoustic wave filters 10 and 20 are band pass filters whose pass bands partly overlap each other. The acoustic wave filter device 1 may preferably be, for example, a Band3/Band39 reception dual filter compliant with the long term evolution (LTE) standard.

The acoustic wave filter 10 includes series resonators 11 and 14 and longitudinally coupled resonators 12 and 13 which are electrically connected between an input terminal IN1 and an output terminal OUT1. Each of the series resonators 11 and 14 is defined by a surface acoustic wave resonator. Each of the resonators 12 and 13 is defined by a longitudinally coupled surface acoustic wave filter including reflectors.

The acoustic wave filter 10 is preferably, for example, an unbalanced-input-unbalanced-output band pass filter that filters a reception signal acquired at the input terminal IN1 in the Band3 reception pass band and outputs a resultant signal to the output terminal OUT1.

The acoustic wave filter 20 includes a series resonator and longitudinally coupled resonators 22 and 23 which are electrically connected between an input terminal IN2 and an output terminal OUT2 and a parallel resonator 24 electrically connected between a path electrically connecting each of the longitudinally coupled resonators 22 and 23 and the output terminal OUT2 and a ground terminal GND. Each of the series resonator 21 and the parallel resonator 24 is defined by a surface acoustic wave resonator. Each of the longitudinally coupled resonators 22 and 23 is defined by a longitudinally coupled surface acoustic wave filter including reflectors.

The acoustic wave filter 20 is preferably, for example, an unbalanced-input-unbalanced-output band pass filter that filters a reception signal acquired at the input terminal IN2 in the Band39 reception pass band and outputs a resultant signal to the output terminal OUT2.

The input terminals IN1 and IN2 may be connected to, for example, an antenna element or an antenna switch. The output terminals OUT1 and OUT2 may be connected to, for example, a low-noise amplifier (LNA). Of high-frequency signals received at an antenna terminal, the acoustic wave filter device 1 passes reception signals in respective frequency bands and selectively outputs them to the output terminals OUT1 and OUT2.

Figure 2:
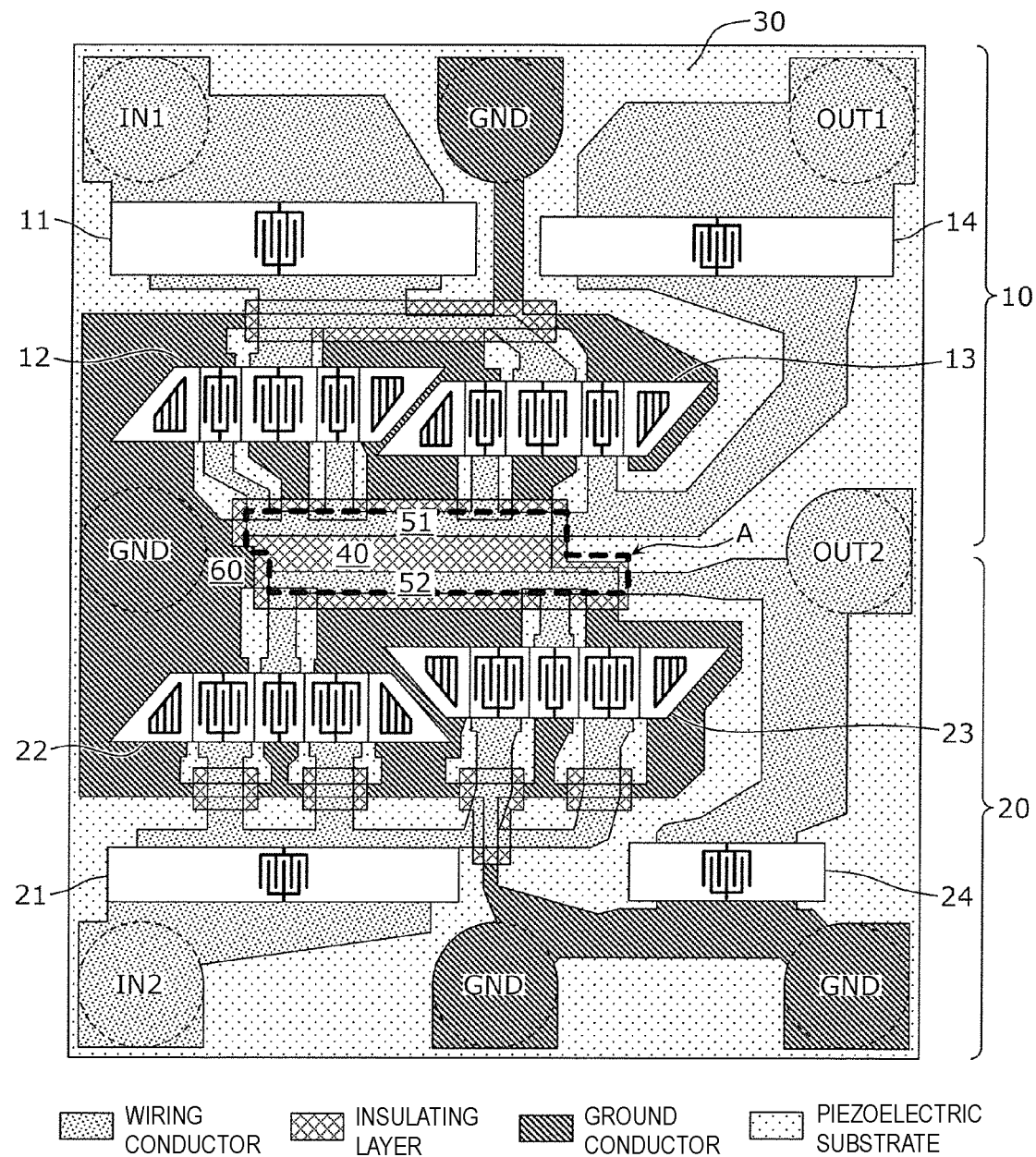
FIG. 2 is a plan view of an acoustic wave filter device according to a preferred embodiment of the present invention which shows an exemplary chip layout of the acoustic wave filter device.

FIG. 2 is a plan view of the acoustic wave filter device 1 which shows an exemplary chip layout of the acoustic wave filter device 1. FIG. 2 shows an exemplary arrangement of a ground conductor, an insulating layer, a wiring conductor, and a resonator which are provided on one main surface of a piezoelectric substrate 30. The ground conductor, the insulating layer, the wiring conductor, and the resonator shown in FIG. 2 define the circuit shown in FIG. 1. The ground conductor, the insulating layer, and the wiring conductor are laminated in this order on one main surface of the piezoelectric substrate 30.

On the other main surface of the piezoelectric substrate 30, connection terminals corresponding to the input terminals IN1 and IN2, the output terminals OUT1 and OUT2, and the ground terminal GND are provided for mounting.

As shown in FIG. 2, each of the series resonators 11, 14, and 21 and the parallel resonator 24 is a surface acoustic wave resonator that is provided on the piezoelectric substrate 30 and includes a pair of comb-shaped electrodes. Each of the resonators 12, 13, 22, and 23 is a longitudinally coupled surface acoustic wave filter that is provided on the piezoelectric substrate 30 and includes three pairs of comb-shaped electrodes and a pair of reflectors sandwiching the three pairs of comb-shaped electrodes. The comb-shaped electrode is also referred to as an interdigital transducer (IDT) electrode. The comb-shaped electrode is electrically connected to the ground conductor or the wiring conductor. The comb-shaped electrode may be made of the same or substantially the same material as the ground conductor or the wiring conductor, and may be a portion of the ground conductor or the wiring conductor.

Figure 3:
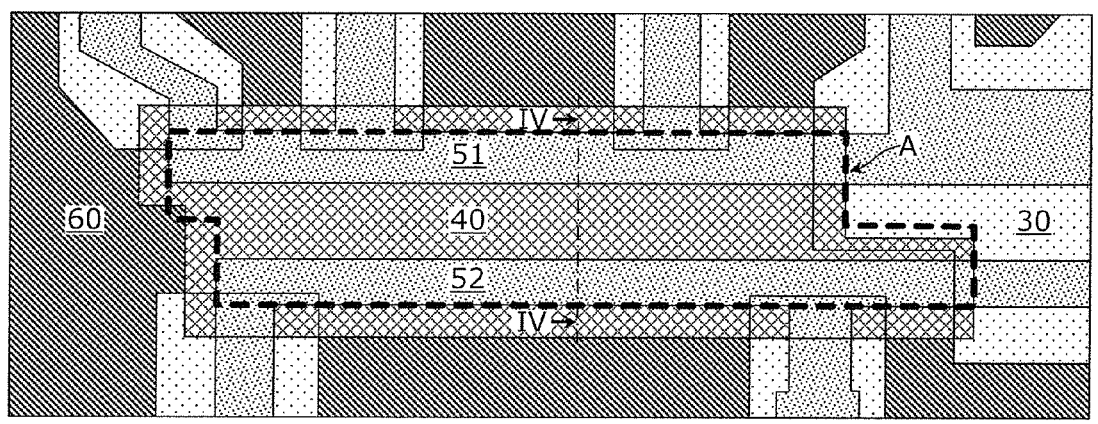
FIG. 3 is an enlarged plan view of an acoustic wave filter device according to a preferred embodiment of the present invention which shows an exemplary chip layout of a main portion of the acoustic wave filter device.

FIG. 3 is an enlarged plan view of the acoustic wave filter device 1 which shows an exemplary chip layout of a main portion of the acoustic wave filter device 1.

Figure 4:
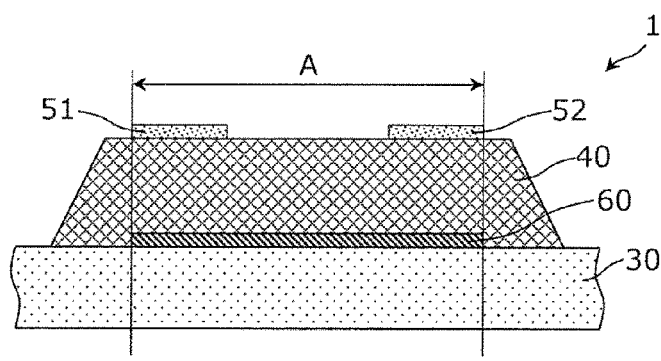
FIG. 4 is a cross-sectional view of an acoustic wave filter device according to a preferred embodiment of the present invention which shows an example of a main portion of the acoustic wave filter device.

FIG. 4 is a cross-sectional view of the acoustic wave filter device 1 which shows an example of a main portion of the acoustic wave filter device 1. FIG. 4 shows the cross section when a IV-IV line in FIG. 3 is viewed from a direction represented by arrows.

In the main portion shown in FIGS. 3 and 4, the acoustic wave filter device 1 includes the piezoelectric substrate 30, an insulating layer 40 provided on the piezoelectric substrate 30, and the wiring conductors 51 and 52 facing each other on the insulating layer 40. The wiring conductor 51 is electrically connected to the comb-shaped electrodes of the resonators 12 and 13 in the acoustic wave filter 10. The wiring conductor 52 is electrically connected to the comb-shaped electrodes of the resonators 22 and 23 in the acoustic wave filter 20 (see FIG. 1).

The piezoelectric substrate 30 is preferably made of, for example, a piezoelectric material such as single-crystal lithium tantalite or ceramics. The insulating layer 40 is preferably made of, for example, a dielectric material such as polyimide having a smaller dielectric constant than the piezoelectric substrate 30. Each of the wiring conductors 51 and is preferably made of, for example, a metallic material including at least one of copper, aluminum, and silver.

The acoustic wave filter device 1 further includes, in a region A circumscribing the wiring conductors 51 and 52 on the insulating layer 40 in plan view, a ground conductor 60 between the insulating layer 40 and the piezoelectric substrate 30.

Thus, in the acoustic wave filter device 1 in which the insulating layer 40 having a smaller dielectric constant than the piezoelectric substrate 30 is located between each of the wiring conductors 51 and 52 and the piezoelectric substrate 30, the capacitive coupling between the adjacent conductors 51 and 52 is significantly reduced or prevented as in the related art.

Since the ground conductor 60 between the insulating layer 40 and the piezoelectric substrate 30 in the region A prevents the coupling between the wiring conductors 51 and 52 in the acoustic wave filter device 1, direct leakage of a signal between the wiring conductors 51 and 52 is significantly reduced or prevented.

In particular, in the region A, the ground conductor 60 is integrally provided in a region from a portion overlapping the wiring conductor 51 to a portion overlapping the wiring conductor in plan view. This reduces the impedance of the ground conductor 60 (that is, strengthens the ground). As a result, the leakage of a signal is more strongly reduced or prevented and excellent insertion loss characteristics is provided.

An additional region for the disposition of the ground conductor 60 is not needed. The ground conductor 60 overlaps the wiring conductors 51 and 52. The acoustic wave filter device 1 is not therefore increased in size. As a result, the acoustic wave filter device 1 that includes the acoustic wave filters 10 and 20, is small in size, and has excellent insertion loss characteristics is provided.

A result of a simulation performed to check this advantageous effect will be described.

Figure 5:
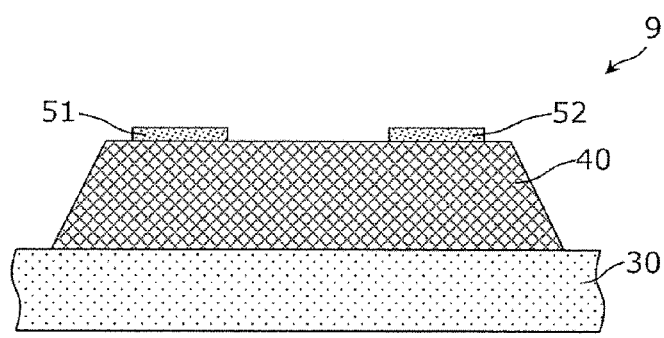
FIG. 5 is a cross-sectional view of an acoustic wave filter device that is a comparative example which shows an example of a main portion of the acoustic wave filter device.

FIG. 5 is a cross-sectional view of an acoustic wave filter device that is a comparative example which shows an example of a main portion of the acoustic wave filter device. The example shown in FIG. 5 differs from the example shown in FIG. 4 in that the ground conductor 60 is not provided. The insertion losses of the acoustic wave filters 10 and 20 in the case where the ground conductor 60 is provided (the first preferred embodiment) and is not provided (comparative example) were provided by conducting an electromagnetic field simulation using the configurations shown in FIGS. 4 and 5.

Figure 6:
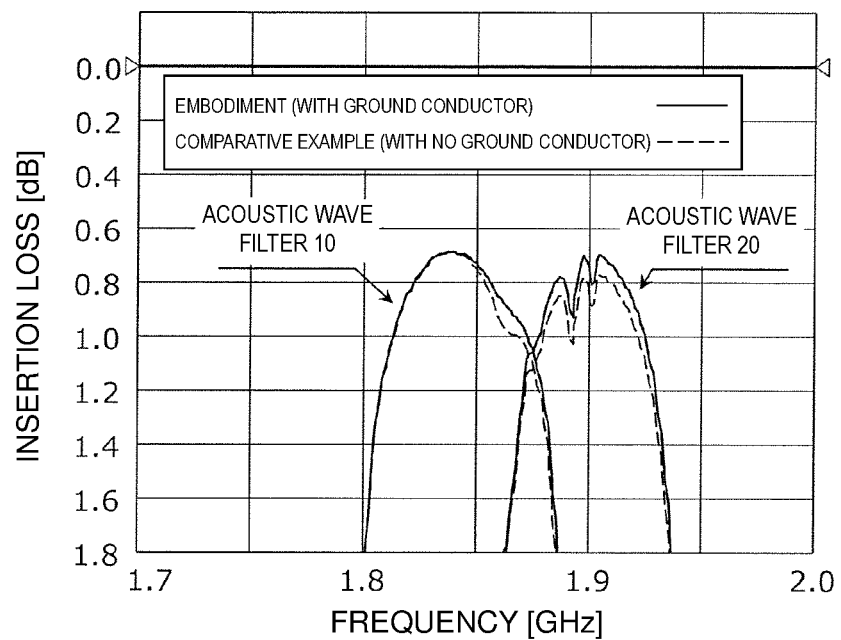
FIG. 6 is a graph showing exemplary insertion loss characteristics of an acoustic wave filter device according to a preferred embodiment of the present invention and an acoustic wave filter device that is a comparative example.

FIG. 6 is a graph showing exemplary insertion loss frequency characteristics of the acoustic wave filters 10 and 20 calculated for the first preferred embodiment and the comparative example. As shown in FIG. 6, it was discovered that the insertion loss characteristics of both of the acoustic wave filters 10 and 20 were significantly improved with the ground conductor 60.

Although an acoustic wave filter device according to a preferred embodiment of the present invention has been described, the present invention is not limited to each preferred embodiment. Various modifications to the preferred embodiments that can be conceived by those skilled in the art, and configurations obtained by combining elements in different preferred embodiments without departing from the teachings of the present invention may be included in the scope of one or more preferred embodiments of the present invention.

For example, the advantageous effect of preventing the coupling between the wiring conductors 51 and 52 is achieved by the ground conductor provided in a gap portion between the wiring conductors 51 and 52 in the region A in plan view with more certainty. At least a portion of the ground conductor may be provided in the gap portion between the wiring conductors 51 and 52 in the region A in plan view. For example, the ground conductor 60 shown in FIG. 4 satisfies this condition. Another modification to be described below is also considered.

Figure 7A:
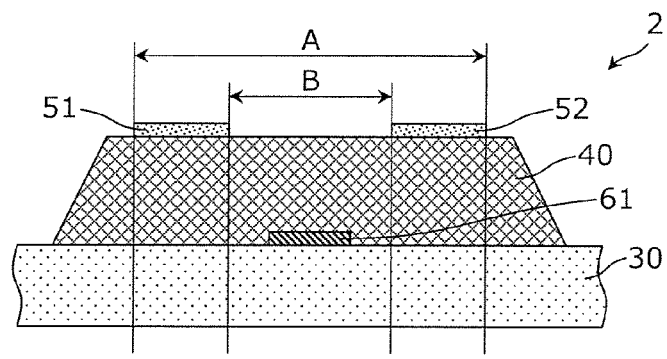
FIG. 7A is a cross-sectional view of an acoustic wave filter device that is a modification of a preferred embodiment of the present invention which shows an example of a main portion of the acoustic wave filter device.
Figure 7B:
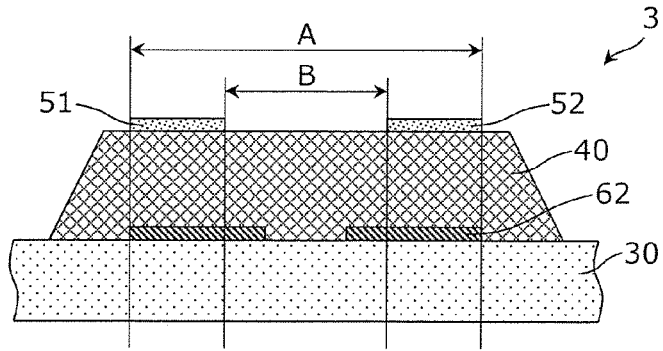
FIG. 7B is a cross-sectional view of an acoustic wave filter device that is a modification of a preferred embodiment of the present invention which shows an example of a main portion of the acoustic wave filter device.

FIGS. 7A and 7B are cross-sectional views of an acoustic wave filter device that is a modification of a preferred embodiment of the present invention which shows an example of a main portion of the acoustic wave filter device. A region B corresponds to the gap portion between the wiring conductors 51 and 52 in the region A in plan view.

In an acoustic wave filter device 2 shown in FIG. 7A, a ground conductor 61 is provided in only the region B.

In an acoustic wave filter device 3 shown in FIG. 7B, a ground conductor 62 is provided at a position where the ground conductor 62 overlaps the wiring conductors 51 and 52 and partly enters the region B in plan view.

With these configurations in which at least a portion of the ground conductor is provided in the gap portion between the wiring conductors 51 and 52 in the region A in plan view, the coupling between the wiring conductors 51 and 52 is prevented and insertion loss characteristics is significantly improved.

Some modifications of the configuration of the insulating layer 40 are also considered.

Figure 8A:
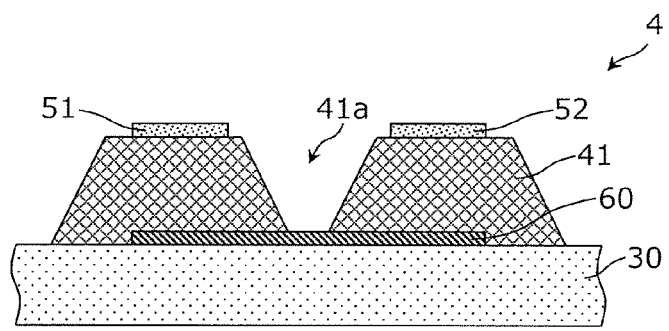
FIG. 8A is a cross-sectional view of an acoustic wave filter device that is a modification of a preferred embodiment of the present invention which shows an example of a main portion of the acoustic wave filter device.
Figure 8B:
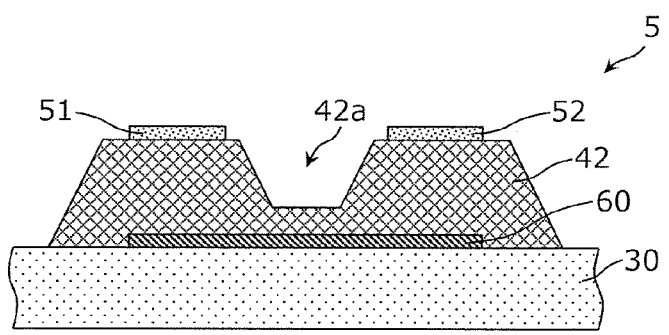
FIG. 8B is a cross-sectional view of an acoustic wave filter device that is a modification of a preferred embodiment of the present invention which shows an example of a main portion of the acoustic wave filter device.
Figure 8C:
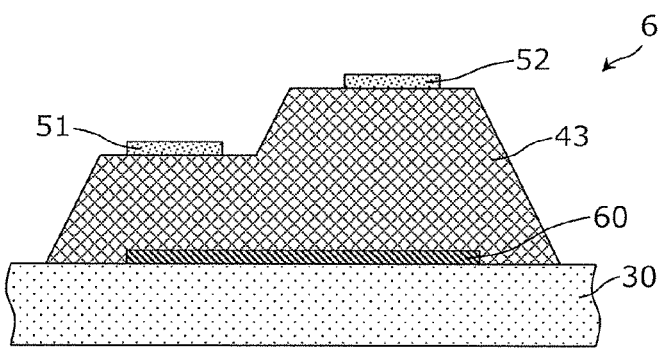
FIG. 8C is a cross-sectional view of an acoustic wave filter device that is a modification of a preferred embodiment of the present invention which shows an example of a main portion of the acoustic wave filter device.

FIGS. 8A to 8C are cross-sectional views of an acoustic wave filter device that is a modification of a preferred embodiment of the present invention which shows an example of a main portion of the acoustic wave filter device.

In an acoustic wave filter device 4 shown in FIG. 8A, an insulating layer 41 includes a notch 41a between the wiring conductors 51 and 52 on the upper surface thereof. The notch 41a extends to the ground conductor 60, so that the insulating layer 41 is separated into two blocks.

In an acoustic wave filter device 5 shown in FIG. 8B, an insulating layer 42 includes a notch 42a between the wiring conductors 51 and 52 on the upper surface thereof. The notch 42a does not extend to the ground conductor 60. The insulating layer 41 is therefore a single block.

With both of the examples shown in FIGS. 8A and 8B in which the wiring conductors 51 and 52 face each other across the respective air gaps provided by the notches 41a and 42a in the insulating layers 41 and 42, the degree of coupling between the wiring conductors 51 and 52 is further reduced and more excellent insertion loss characteristics are provided.

In an acoustic wave filter device 6 shown in FIG. 8C, an insulating layer 43 has different thicknesses beneath the wiring conductors 51 and 52.

With the example shown in FIG. 8C in which the wiring conductors 51 and 52 are provided at different steps, the degree of coupling between the wiring conductors 51 and 52 is further reduced and more excellent insertion loss characteristics can be provided.

In a preferred embodiment of the present invention, an exemplary case where the pass bands of the acoustic wave filters 10 and 20 partly overlap each other has been described. The reduction in the degree of coupling between the wiring conductors 51 and 52 when the pass bands of the acoustic wave filters 10 and 20 partly overlap each other also significantly reduces or prevents the intrusion of signals of the same or substantially the same frequency which interfere with each other. Accordingly, an acoustic wave filter device having not only excellent insertion loss characteristics but also a good signal-to-noise ratio is provided.

The pass bands of the acoustic wave filters 10 and 20 do not necessarily have to partly overlap each other. In a case where the pass bands of the acoustic wave filters 10 and 20 do not overlap each other, one end of the acoustic wave filter 10 and one end of the acoustic wave filter 20 may be connected.

In this case, the number of connection terminals can be reduced because one ends of the acoustic wave filters 10 and 20 are set as a common terminal.

An acoustic wave filter device according to a preferred embodiment of the present invention includes a first acoustic wave filter and a second acoustic wave filter provided on a piezoelectric substrate, an insulating layer that is provided on the piezoelectric substrate and has a smaller dielectric constant than the piezoelectric substrate, a first wiring conductor electrically connected to an electrode of the first acoustic wave filter, a second wiring conductor electrically connected to an electrode of the second acoustic wave filter, the first wiring conductor and the second wiring conductor facing each other on the insulating layer in plan view, and a ground conductor between the insulating layer and the piezoelectric substrate in a region circumscribing the first wiring conductor and the second wiring conductor on the insulating layer in plan view.

With this configuration, the coupling between the first wiring conductor and the second wiring conductor is prevented by the ground conductor. The direct leakage of a signal between the first wiring conductor and the second wiring conductor is therefore significantly reduced or prevented. An additional region for the disposition of the ground conductor is not needed. The ground conductor overlaps the first wiring conductor and the second wiring conductor. The acoustic wave filter device is not therefore increased in size. As a result, an acoustic wave filter device that is small in size and has excellent insertion loss characteristics is provided.

At least a portion of the ground conductor may be provided in a gap portion between the first wiring conductor and the second wiring conductor in the region in plan view.

Since the ground conductor is located at a position where the coupling between the first wiring conductor and the second wiring conductor is more effectively prevented with this configuration, more excellent insertion loss characteristics are provided.

The ground conductor may be integrally provided in a region from a portion overlapping the first wiring conductor to a portion overlapping the second wiring conductor in plan view.

Since the impedance of the ground conductor is reduced (that is, the ground is strengthened) with this configuration, the leakage of a signal is more strongly reduced or prevented and more excellent insertion loss characteristics are provided.

The insulating layer may include a notch between the first wiring conductor and the second wiring conductor on an upper surface of the insulating layer.

Since the first wiring conductor and the second wiring conductor face each other across the notch in the insulating layer with this configuration, the degree of coupling between the first wiring conductor and the second wiring conductor is further reduced and more excellent insertion loss characteristics are provided.

A portion of the insulating layer overlapping the first wiring conductor in plan view and a portion of the insulating layer overlapping the second wiring conductor in plan view may have different thicknesses.

Since the first wiring conductor and the second wiring conductor are provided at different steps with this configuration, the degree of coupling between the first wiring conductor and the second wiring conductor is further reduced and more excellent insertion loss characteristics are provided.

Pass bands of the first acoustic wave filter and the second acoustic wave filter may at least partly overlap each other.

Since the intrusion of signals in a common pass band between the first acoustic wave filter and the second acoustic wave filter (that is, signals that interfere with each other) can be significantly reduced or prevented with this configuration, an acoustic wave filter device having not only excellent insertion loss characteristics but also a good signal-to-noise ratio is provided.

One ends of the first acoustic wave filter and the second acoustic wave filter may be connected.

Since one ends of the first acoustic wave filter and the second acoustic wave filter having different pass bands are commonly connected with this configuration, an acoustic wave filter device that is smaller in size and has excellent insertion loss characteristics is provided.

The present invention is applicable to communication devices, for example, mobile phones as an acoustic wave filter device that includes a plurality of acoustic wave filters, is small in size, and has excellent insertion loss characteristics.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter device comprising:
   a first acoustic wave filter and a second acoustic wave filter provided on a piezoelectric substrate;
   an insulating layer that is provided on the piezoelectric substrate and has a smaller dielectric constant than the piezoelectric substrate;
   a first wiring conductor electrically connected to an electrode of the first acoustic wave filter;
   a second wiring conductor electrically connected to an electrode of the second acoustic wave filter, the first wiring conductor and the second wiring conductor facing each other on the insulating layer in plan view; and
   a ground conductor located between the insulating layer and the piezoelectric substrate in a region circumscribing the first wiring conductor and the second wiring conductor on the insulating layer in plan view; wherein
   a portion of the first wiring conductor and a portion of the second wiring conductor are arranged at different steps.

2. The acoustic wave filter device according to claim 1, wherein the first acoustic wave filter includes two series resonators and two longitudinally coupled resonators that are electrically connected between an input terminal of the acoustic wave filter device and an output terminal of the acoustic wave filter device.

3. The acoustic wave filter device according to claim 2, wherein each of the two series resonators is a surface acoustic wave resonator that is provided on the piezoelectric substrate and includes a pair of interdigital transducer electrodes.

4. The acoustic wave filter device according to claim 2, wherein each of the two longitudinally coupled resonators is provided on the piezoelectric substrate and includes three pairs of interdigital transducer electrodes and a pair of reflectors sandwiching the three pairs of interdigital transducer electrodes.

5. The acoustic wave filter device according to claim 1, wherein the second acoustic wave filter includes a series resonator and two longitudinally coupled resonators that are electrically connected between an input terminal of the acoustic wave filter device and an output terminal of the acoustic wave filter device.

6. The acoustic wave filter device according to claim 5, wherein the second acoustic wave filter further includes a parallel resonator connected between a path connecting the two longitudinally coupled resonators and the output terminal and a ground terminal.

7. The acoustic wave filter device according to claim claim 6, wherein each of the series resonator and the parallel resonator is a surface acoustic wave resonator that is provided on the piezoelectric substrate and includes a pair of interdigital transducer electrodes.

8. The acoustic wave filter device according to claim 5, wherein each of the two longitudinally coupled resonators is provided on the piezoelectric substrate and includes three pairs of interdigital transducer electrodes and a pair of reflectors sandwiching the three pairs of interdigital transducer electrodes.

9. The acoustic wave filter device according to claim 1, wherein the ground conductor, the insulating layer, the first wiring conductor, and the second wiring conductor are laminated in this order on a first main surface of the piezoelectric substrate.

10. The acoustic wave filter device according to claim 9, wherein input terminals of the first and second acoustic wave filters, output terminals of the first and second acoustic wave filters, and a ground terminal are provided on a second main surface of the piezoelectric substrate.

11. The acoustic wave filter device according to claim 1, wherein at least a portion of the ground conductor is provided in a gap portion between the first wiring conductor and the second wiring conductor in the region in plan view.

12. The acoustic wave filter device according to claim 1, wherein the ground conductor is integrally provided in a region from a portion overlapping the first wiring conductor to a portion overlapping the second wiring conductor in plan view.

13. The acoustic wave filter device according to claim 1, wherein the insulating layer includes a notch between the first wiring conductor and the second wiring conductor on an upper surface of the insulating layer.

14. The acoustic wave filter device according to claim 1, wherein a portion of the insulating layer overlapping the first wiring conductor in plan view and a portion of the insulating layer overlapping the second wiring conductor in plan view have different thicknesses.

15. The acoustic wave filter device according to claim 1, wherein pass bands of the first acoustic wave filter and the second acoustic wave filter at least partly overlap each other.

16. The acoustic wave filter device according to claim 1, wherein one ends of the first acoustic wave filter and the second acoustic wave filter are electrically connected to each other.

17. The acoustic wave filter device according to claim 1, wherein the first acoustic wave filter and the second acoustic wave filter are each an unbalanced-input-unbalanced-output band pass filter.

18. The acoustic wave filter device according to claim 1, wherein
the first wiring conductor and the second wiring conductor are provided on an upper surface of the insulating layer;
a notch is provided in the upper surface of the insulating layer; and
the notch separates the first wiring conductor from the second wiring conductor.

19. An acoustic wave filter device comprising:
a first acoustic wave filter and a second acoustic wave filter provided on a piezoelectric substrate;
an insulating layer that is provided on the piezoelectric substrate and has a smaller dielectric constant than the piezoelectric substrate;
a first wiring conductor electrically connected to an electrode of the first acoustic wave filter;
a second wiring conductor electrically connected to an electrode of the second acoustic wave filter, the first wiring conductor and the second wiring conductor facing each other on the insulating layer in plan view; and
a ground conductor located between the insulating layer and the piezoelectric substrate in a region circumscribing the first wiring conductor and the second wiring conductor on the insulating layer in plan view; wherein
a portion of the insulating layer directly overlapping the first wiring conductor in plan view and a portion of the insulating layer directly overlapping the second wiring conductor in plan view have different thicknesses.

* * * * *